United States Patent
Ota

(10) Patent No.: US 7,851,969 B2
(45) Date of Patent: Dec. 14, 2010

(54) PIEZOELECTRIC-ACTUATOR DRIVING DEVICE AND EXPOSURE APPARATUS INCLUDING THE SAME

(75) Inventor: Jun Ota, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 196 days.

(21) Appl. No.: 12/242,179

(22) Filed: Sep. 30, 2008

(65) Prior Publication Data

US 2009/0092929 A1    Apr. 9, 2009

(30) Foreign Application Priority Data

Oct. 9, 2007    (JP)    ............... 2007-263494

(51) Int. Cl.
*H01L 41/09* (2006.01)
*H01L 41/22* (2006.01)
*G03B 21/00* (2006.01)

(52) U.S. Cl. ............... 310/317; 310/316.03; 29/25.35; 359/443

(58) Field of Classification Search ............ 310/316.03, 310/317; 29/25.35; 359/443
See application file for complete search history.

(56) References Cited

U.S. PATENT DOCUMENTS

| | | | | |
|---|---|---|---|---|
| 5,786,654 A | * | 7/1998 | Yoshida et al. | ............... 310/328 |
| 6,147,434 A | * | 11/2000 | Nakano et al. | ............... 310/317 |
| 6,193,032 B1 | * | 2/2001 | Lesieutre et al. | ............ 188/380 |

FOREIGN PATENT DOCUMENTS

| | | |
|---|---|---|
| JP | 2002-185056 A | 6/2002 |
| JP | 2002-257000 A | 9/2002 |

\* cited by examiner

*Primary Examiner*—Thomas M Dougherty
(74) *Attorney, Agent, or Firm*—Canon U.S.A., Inc. I.P. Division

(57) ABSTRACT

A driving device includes a plurality of laminated units formed by alternately stacking piezoelectric element layers and electrode layers, a failure detecting unit configured to detect failure of the laminated units, a plurality of switches provided corresponding to the laminated units and configured to enable and disable current supply to the laminated units, and a driving circuit configured to supply a current for driving to a normal laminated unit of the laminated units, on the basis of an output from the failure detecting unit.

7 Claims, 6 Drawing Sheets

PIEZOELECTRIC-ACTUATOR DRIVING DEVICE AND EXPOSURE APPARATUS INCLUDING THE SAME

BACKGROUND OF THE INVENTION

1. Field of the Invention

The present invention relates to a driving device using a piezoelectric actuator.

2. Description of the Related Art

Positioning devices currently used to position optical elements in semiconductor exposure apparatuses are required to have a high positioning accuracy of the order of nanometers. For this reason, piezoelectric actuators are used to drive the positioning devices.

A laminated piezoelectric actuator has a structure in which thin layers of piezoelectric ceramics and electrode layers are alternately stacked to form several hundreds of layers. In general, polarization and voltage application are performed by using a wire connected to an electrode layer serving as an anode and a wire connected to an electrode layer serving as a cathode.

Since the voltage is applied via a pair of wires in the laminated piezoelectric actuator, insulation performance may be reduced by migration, and this may cause a short circuit between the electrodes. Also, failure may occur in wire connection. In this case, it is difficult to apply the voltage to the piezoelectric ceramics, and the actuator may lose its function.

The following mechanisms for avoiding driving failure of the laminated piezoelectric actuator have been disclosed.

Japanese Patent Laid-Open No. 2002-257000 discloses that driving can be performed even when failure occurs in wire connection in a fuel injection apparatus including a plurality of piezoelectric actuators. More specifically, a plurality of piezoelectric actuators and a plurality of switches are connected in one-to-one correspondence, and, when failure occurs in wire connection for one of the piezoelectric actuators, the corresponding switch is merely turned off, so that the driving of the remaining piezoelectric actuators is prevented from being affected by the failure.

Japanese Patent Laid-Open No. 2002-185056 discloses a technique of checking a piezoelectric actuator for failure. In this technique, a reference piezoelectric actuator that normally operates is connected to a target piezoelectric actuator in parallel. First, charges accumulated by charging the reference piezoelectric actuator at a fixed voltage are released to the target piezoelectric actuator. Then, the voltage of the reference piezoelectric actuator is detected so as to check whether the target piezoelectric actuator is normal.

Unfortunately, the above-described known techniques are not suitable for precise positioning apparatuses like exposure apparatuses for the following reasons.

In Japanese Patent Laid-Open No. 2002-257000, the piezoelectric actuators are used to open and close fuel injectors. Since the piezoelectric actuators are provided corresponding to a plurality of cylinders, even when one of the piezoelectric actuators breaks down, the cylinders corresponding to the other piezoelectric actuators can be used.

However, for example, when a plurality of optical elements in a projection optical system of an exposure apparatus are driven and a piezoelectric actuator corresponding to one optical element breaks down, it is difficult to maintain exposure accuracy by driving the optical elements corresponding to the other piezoelectric actuators.

In other words, when a short circuit is caused by migration in the piezoelectric actuator, it is determined that the exposure apparatus has broken down, and the piezoelectric actuator needs to be replaced. However, in order to replace the piezoelectric actuator, it is necessary to stop the operation of the exposure apparatus. This takes much time and much cost.

It is difficult for the current technology to completely prevent the piezoelectric actuator from migration. Accordingly, there is a demand for a driving device that can continuously drive the apparatus even when a short circuit is caused by migration.

SUMMARY OF THE INVENTION

The present invention provides a driving device including a laminated piezoelectric actuator which has a plurality of laminated units arranged in series and in which a short-circuited laminated unit can be separated from a driving circuit.

A driving device according to an embodiment of the present invention includes a plurality of laminated units formed by alternately stacking piezoelectric element layers and electrode layers; a failure detecting unit configured to detect failure of one or more of the laminated units; a plurality of switches provided corresponding to the laminated units and each configured to enable and disable current supply to one of the laminated units; and a driving circuit configured to supply a current for driving to a laminated unit of the laminated units which is not detected to be faulty, on the basis of an output from the failure detecting unit.

Further features of the present invention will become apparent from the following description of exemplary embodiments with reference to the attached drawings.

DESCRIPTION OF THE EMBODIMENTS

Figure 1:
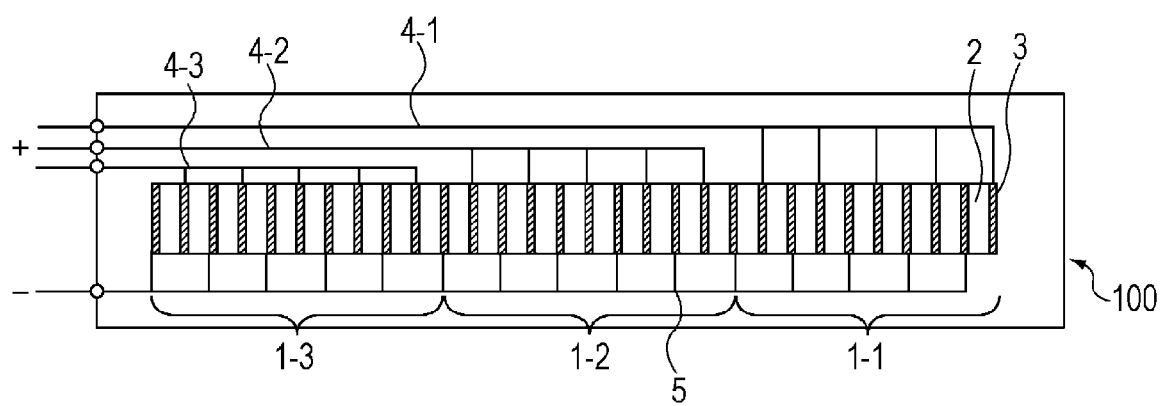
FIG. 1 shows a configuration of a laminated piezoelectric actuator according to an embodiment of the present invention in which a plurality of laminated units are arranged in series.

In a preferred embodiment of the present invention, a piezoelectric actuator serving as a driving device includes a plurality of laminated units. The laminated units include a plurality of piezoelectric elements and a plurality of electrode layers, and are arranged in series. Leads serving as an anode and a cathode are connected to each laminated unit. By electrically connecting the laminated units in parallel, voltages can be independently applied to the laminated units.

A switch is connected to each laminated unit, and is able to provide on/off control. A failure detecting unit is provided to detect failure of any of the laminated units. Only a laminated unit whose failure has been detected is separated from a driving circuit by using the switch. This allows the driving device to be used continuously even when one or more laminated units fail.

A laminated unit whose failure has been detected can be separated from the driving circuit by turning off only the corresponding switch connected to the laminated unit, and this does not affect the operations of the other laminated units which operate normally. The same number of switches as the number of laminated units are provided. The driving circuit supplies a current for driving to a normal laminated unit (i.e. one for which a failure has not been detected) of a plurality of laminated units, on the basis of the output from the failure detecting unit.

As the failure detecting unit, for example, a detection unit for detecting currents passing through a plurality of laminated units or voltages applied to a plurality of laminated units, and a comparison unit for comparing the output of the detection unit with a predetermined reference value can be used. On the basis of the comparison result, the occurrence of failure is detected. For example, when currents are detected, a current much more than in a normal state passes through a piezoelectric actuator that has undergone insulation failure or a short circuit. Hence, insulation failure or a short circuit can be detected by comparing the current passing through the piezoelectric actuator with a normal value (reference value).

Alternatively, as the failure detecting unit, for example, a detection unit for detecting displacement of a plurality of laminated units, and a comparison unit for comparing the output of the detection unit with a predetermined reference value can be used. On the basis of the comparison result, the occurrence of failure is detected. When the driving device is in a normal state, the displacement amount in accordance with the applied voltage is fixed. In contrast, when insulation failure or a short circuit occurs, the displacement amount of the piezoelectric actuator in accordance with the applied voltage becomes smaller than in the normal state, or the displacement amount becomes zero. For this reason, when insulation failure or a short circuit occurs, it can be detected by comparing the displacement amount of the piezoelectric actuator with the expected normal value.

When insulation failure or a short circuit occurs in the piezoelectric actuator, a controller sequentially connects the laminated units one by one by the switches. Then, the failure detecting unit detects insulation failure or a short circuit, and detects a laminated unit in which the insulation failure or short circuit has occurred.

The present invention will now be described in further detail with reference to embodiments.

First Embodiment

FIG. 1 shows a configuration of a laminated piezoelectric actuator (driving device) according to a first embodiment of the present invention. In a piezoelectric actuator 100 according to the first embodiment, multiple thin piezoelectric ceramics plates 2 and multiple electrode layers 3 are alternately stacked and combined. The piezoelectric actuator 100 is charged and discharged through leads 4-1, 4-2, 4-3, and 5 connected to the electrode layers 3.

The piezoelectric actuator 100 is divided into three laminated units 1-1, 1-2, and 1-3. The leads 4-1, 4-2, and 4-3 are connected to the electrode layers 3 serving as anodes, and the lead 5 is commonly connected to the electrode layers 3 serving as cathodes. By being electrically connected in parallel, the laminated units 1-1, 1-2, and 1-3 can be charged and discharged independently. Mechanically, the laminated units 1-1, 1-2, and 1-3 are arranged in series in the expanding and contracting direction thereof. In other words, the amounts of expansion or contraction of the laminated units 1-1, 1-2, and 1-3 are added.

Figure 2:
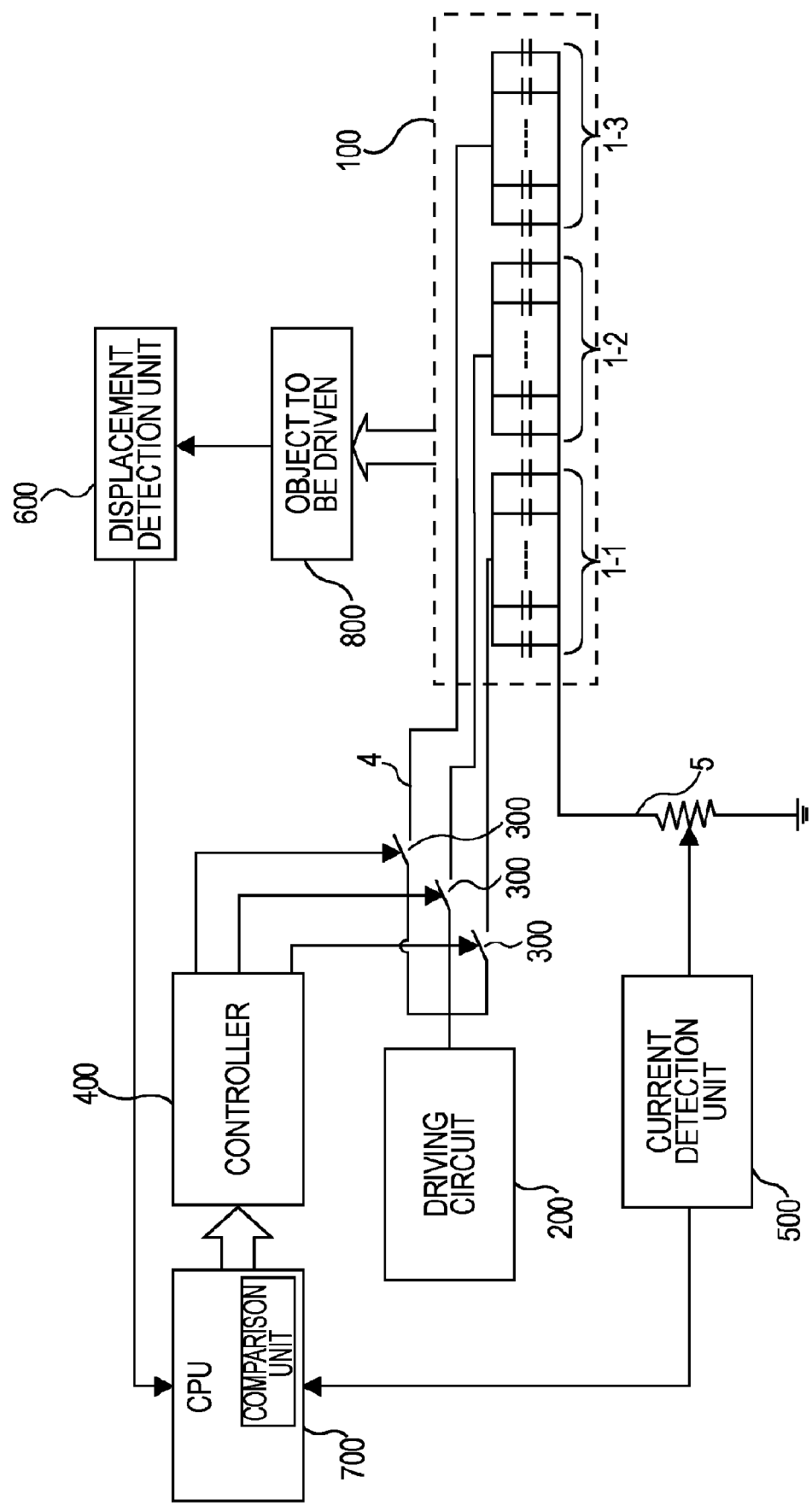
FIG. 2 is a schematic view of a driving device for driving the laminated piezoelectric actuator shown in FIG. 1.

FIG. 2 shows a driving device including the piezoelectric actuator 100 shown in FIG. 1 and a detection unit for detecting failure of the piezoelectric actuator 100. The driving device includes a driving circuit 200, switches 300, a controller 400, a current detection unit 500, and a displacement detection unit 600. The driving circuit 200 supplies currents for charging and discharging to the piezoelectric actuator 100 so as to drive the piezoelectric actuator 100. The switches 300 are connected to the leads 4-1, 4-2, and 4-3 on the anode sides of the laminated units 1-1, 1-2, and 1-3 in the piezoelectric actuator 100. The controller 400 outputs control signals for on/off control of the switches 300. The current detection unit 500 detects the current of the piezoelectric actuator 100 from the lead 5 on the cathode side of the piezoelectric actuator 100. The displacement detection unit 600 detects the displacement amount of the piezoelectric actuator 100. A first failure detecting unit includes the current detection unit 500 and a first comparison unit (comparison circuit) for comparing the detected current with a predetermined first reference value. A second failure detecting unit includes the displacement detection unit 600 and a second comparison unit (comparison circuit) for comparing the detected displacement amount with a preset second reference value. These comparison units are provided in a CPU 700. The term "failure" mainly refers to a short circuit caused in the piezoelectric actuator by, for example, insulation failure between the electrodes.

Figure 3:
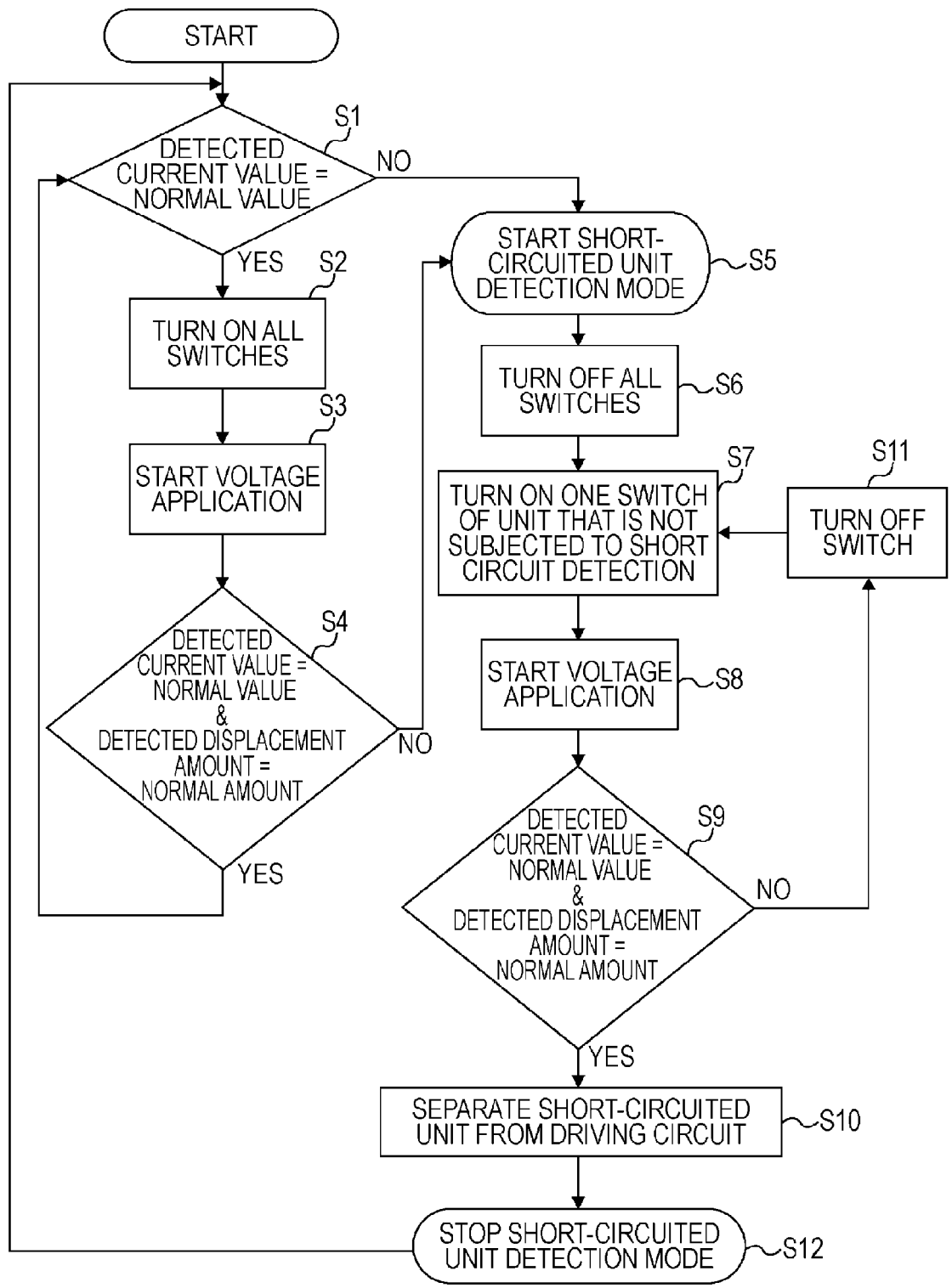
FIG. 3 is a flowchart showing a procedure for detecting a short circuit of a laminated unit in the driving device shown in FIG. 2.

FIG. 3 shows a procedure for detecting failure of the piezoelectric actuator 100. The CPU 700 controls the operations of the driving circuit 200, the current detection unit 500, and the displacement detection unit 600. First, in Step S1, the CPU 700 compares a detected current value with a preset reference current value, and sends the comparison result to the controller 400. When the detected current value satisfies the criterion, the controller 400 determines that there is no failure. A case in which the criterion is satisfied means, for example, that the detected current value is less than or equal to the reference current value, or that the detected current value is within a range between two reference current values. When the controller 400 determines that the piezoelectric actuator 100 is operating normally, the procedure proceeds to Step S2. In Step S2, all the switches 300 of the laminated units are turned on, and voltage application or discharging is started in Step S3. In contrast, when the detected current value does not satisfy the criterion, it is determined that the piezoelectric actuator 100 is faulty, and the voltage application to the piezoelectric actuator 100 is stopped. In this case, Step S5 is then performed.

In Step S3, the controller 400 applies an arbitrary voltage to the piezoelectric actuator 100 so as to drive an object 800. In Step S4, the displacement detection unit 600 detects a displacement amount of the object 800 (or a displacement amount of the piezoelectric actuator 100), and sends the detected value to the CPU 700. The CPU 700 compares the detected value with a reference displacement amount of the piezoelectric actuator 100 with respect to the applied voltage, and sends the comparison result to the controller 400. In a manner similar to that adopted before the voltage is applied, the current detection unit 500 for detecting the current of the piezoelectric actuator 100 sends a detected current value to the CPU 700. The CPU 700 compares the detected current value with a reference current value, and sends the comparison result to the controller 400. When the displacement amount and current value of the piezoelectric actuator 100 satisfy the criteria, it is determined that the piezoelectric actuator 100 is operating normally. However, when both the values do not satisfy the criteria, it is determined that the piezoelectric actuator 100 is faulty, the application of voltage to the piezoelectric actuator 100 is stopped, and Step S5 is then performed.

In Step S5 and subsequent steps, it is determined which laminated unit in the piezoelectric actuator 100 is faulty. Steps S5 and subsequent steps will now be described. In Step S5, detection of a faulty laminated unit is started. In Step S6, all the switches 300 connected to the laminated units 1-1, 1-2, and 1-3 are turned off. Next, one of the switches 300 is turned on in Step S7, and a test voltage is applied thereto in Step S8. In Step S9, a current value and a displacement amount in accordance with the test voltage are detected by the current detection unit 500 and the displacement detection unit 600, and are compared with the reference values so as to determine whether the on-state laminated unit is operating normally. When it is determined that the laminated unit is operating normally, determination about the laminated unit is completed, Step S11 is performed, and determination about the next laminated unit is performed. In contrast, when it is determined that the laminated unit is short-circuited, the use of the corresponding switch is stopped in Step S10. The faulty laminated unit is thereby separated from the driving circuit 200, and the failure detection is completed in Step S12. The driving circuit 200 supplies driving currents to the other laminated units, which are operating normally, on the basis of the output from the failure detecting unit.

According to the first embodiment, each laminated unit can be electrically separated from the driving circuit, and a faulty laminated unit is separated from the driving circuit. The piezoelectric actuator according to the first embodiment has an advantage over the piezoelectric actuator as the related art in its capability to prevent the operation of the driving device from being completely stopped by failure. For example, when it is assumed that the probability that failure will occur between electrodes in one piezoelectric actuator is designated as "a", the probability that the operation of the piezoelectric actuator as the related art will be completely stopped, in other words, the probability that the piezoelectric actuator as the related art will break down is "a". In contrast, when the piezoelectric actuator is divided into an n-number of units as in the first embodiment, the probability that failure will occur in each unit is "a/n", and the probability that the operation of the piezoelectric actuator will be completely stopped, in other words, the probability that failure will occur in all units is "$(a/n)^n$". Therefore, reliability becomes higher than in the related art.

Second Embodiment

Figure 4:
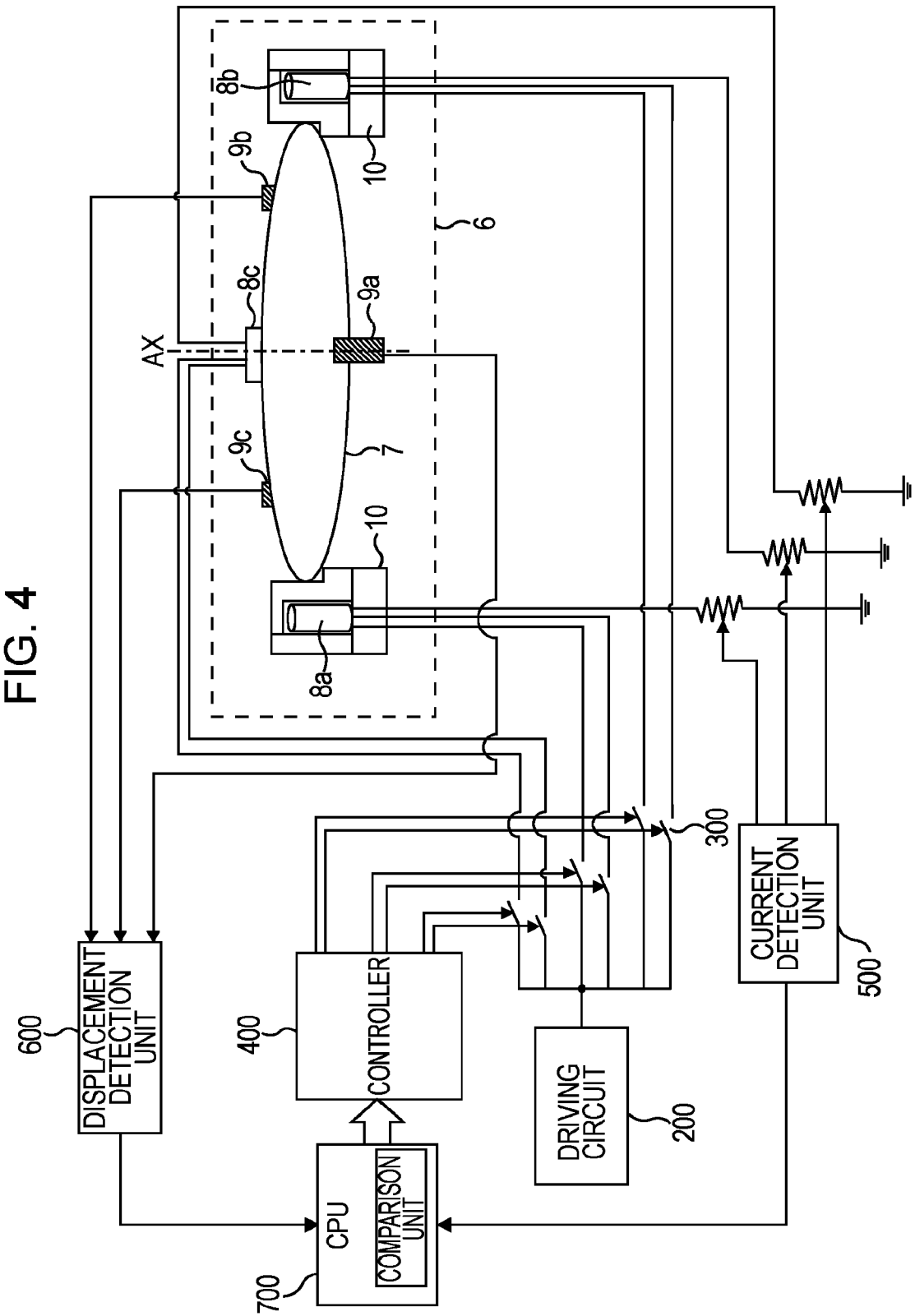
FIG. 4 shows a configuration of a lens driving device provided in an exposure apparatus to which the embodiment of the present invention is applied.

FIG. 4 shows a lens driving device according to a second embodiment of the present invention. The lens driving device is preferably used to drive a lens in a projection optical system of an exposure apparatus. The lens driving device includes three piezoelectric actuators 8a, 8b, and 8c. This structure allows a lens 7 to be driven in a direction parallel to the optical axis AX or to be inclined with respect to the optical axis AX. In each piezoelectric actuator, two laminated units are arranged in series. Switches 300 are connected to the corresponding laminated units, and on/off control can be exerted on the switches 300 according to a control signal from a controller 400. The piezoelectric actuators 8a, 8b, and 8c are connected to a current detection unit 500 for detecting current values of the piezoelectric actuators, and the detected current values are sent to a CPU 700. Further, a displacement detection unit 600 includes three displacement sensors 9a, 9b, and 9c, and can detect displacement amounts of the piezoelectric actuators. The detected displacement amounts are sent to the CPU 700. The CPU 700 receives signals from the current detection unit 500 and the displacement detection unit 600, enables or disables the current supply to the laminated units in the piezoelectric actuators according to the procedure shown in FIG. 3, and then sends a selection signal to the controller 400. According to the received signal, the controller 400 sends signals for turning on and off the switches 300 connected to the piezoelectric actuators.

While the embodiments of the present invention have been described above, it should be noted that the present invention is not limited to these embodiments, and that various modifications and alterations are possible within the scope of the invention.

Third Embodiment

For example, while two or three laminated units are arranged in series in each piezoelectric actuator in the above-described first and second embodiments, an arbitrary number of laminated units can be arranged in series. Further, the number and wiring manner of the leads 4-1, 4-2, 4-3, and 5 serving as the anodes and the cathode are not particularly limited as long as the leads are electrically connected in parallel. The driving device according to the embodiment of the present invention is not limited to the lens driving device in the exposure apparatus, and is also applicable to driving devices such as a wafer stage and a mask stage.

While the switch is used to separate a faulty laminated unit in the first and second embodiments, for example, it may be replaced with a fuse.

Fourth Embodiment

Figure 5:
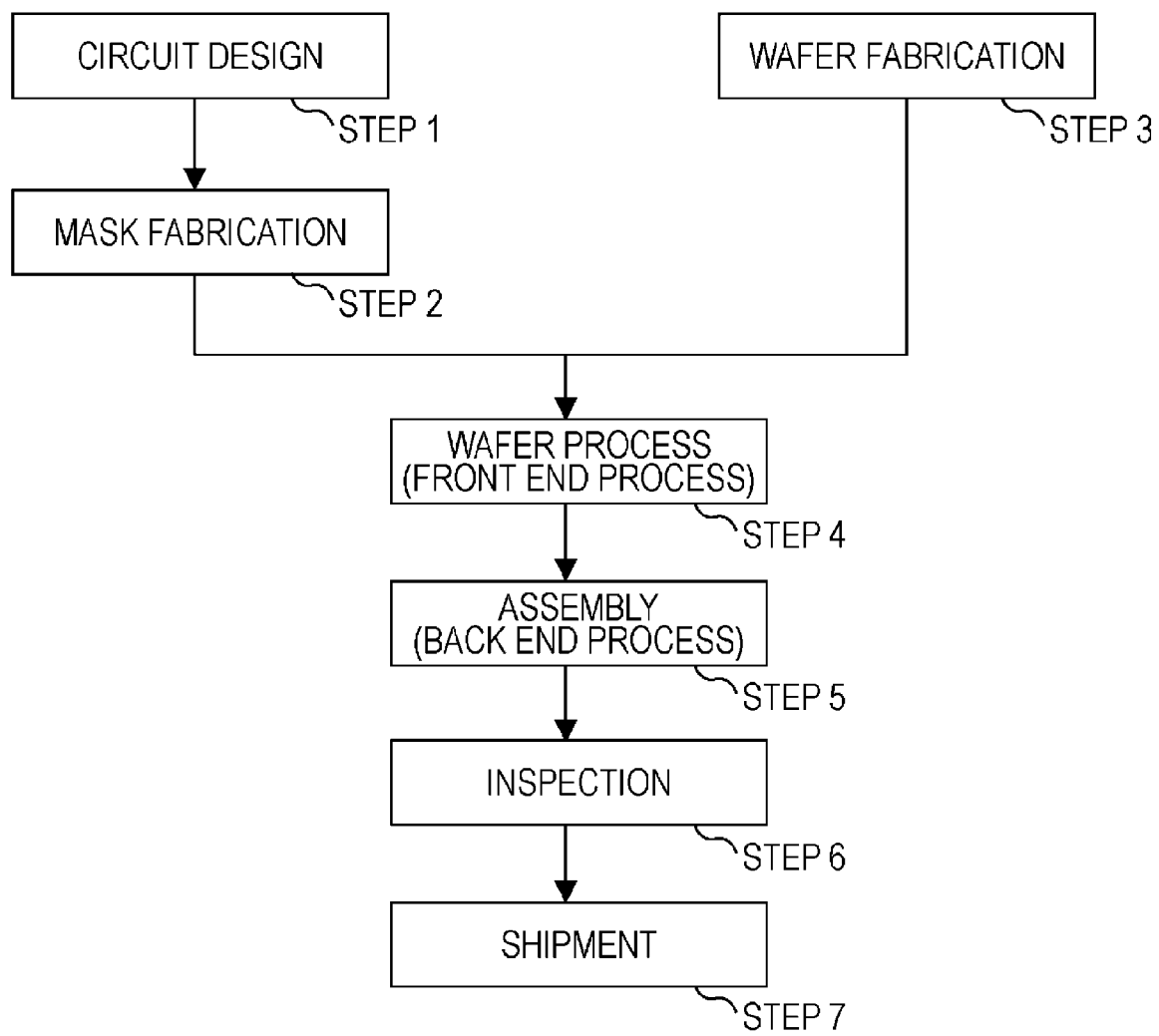
FIG. 5 is a flowchart showing a device manufacturing process using the exposure apparatus.

A device manufacturing method according to a fourth embodiment using an exposure apparatus to which the lens driving device shown in FIG. 4 is applied will now be described with reference to FIGS. 5 and 6. FIG. 5 is a flowchart explaining manufacturing of a device (a semiconductor chip such as an IC or an LSI, an LCD, or a CCD). Herein, a manufacturing method for a semiconductor chip will be described as an example.

In Step S1 (circuit design), a circuit pattern of a semiconductor device is designed. In Step S2 (mask fabrication), a mask (also referred to as an original or a reticle) is fabricated on the basis of the designed circuit pattern. In Step S3 (wafer fabrication), a wafer (also referred to as a substrate) is formed of, for example, silicon. In Step S4 (wafer process) called a front end process, an actual circuit is formed on the wafer by using the mask and the wafer by lithography with the above-described exposure apparatus. In Step S5 (assembly) called a back end process, a semiconductor chip is produced by using the wafer fabricated in Step S4. The back end process includes, for example, an assembly step (dicing, bonding) and a packaging step (chip encapsulation). In Step S6 (inspection), the semiconductor chip produced in Step S5 is subjected to various inspections such as an operation confirmation test and a durability test. A semiconductor device is completed through the above steps, and is then shipped (Step S7).

Figure 6:
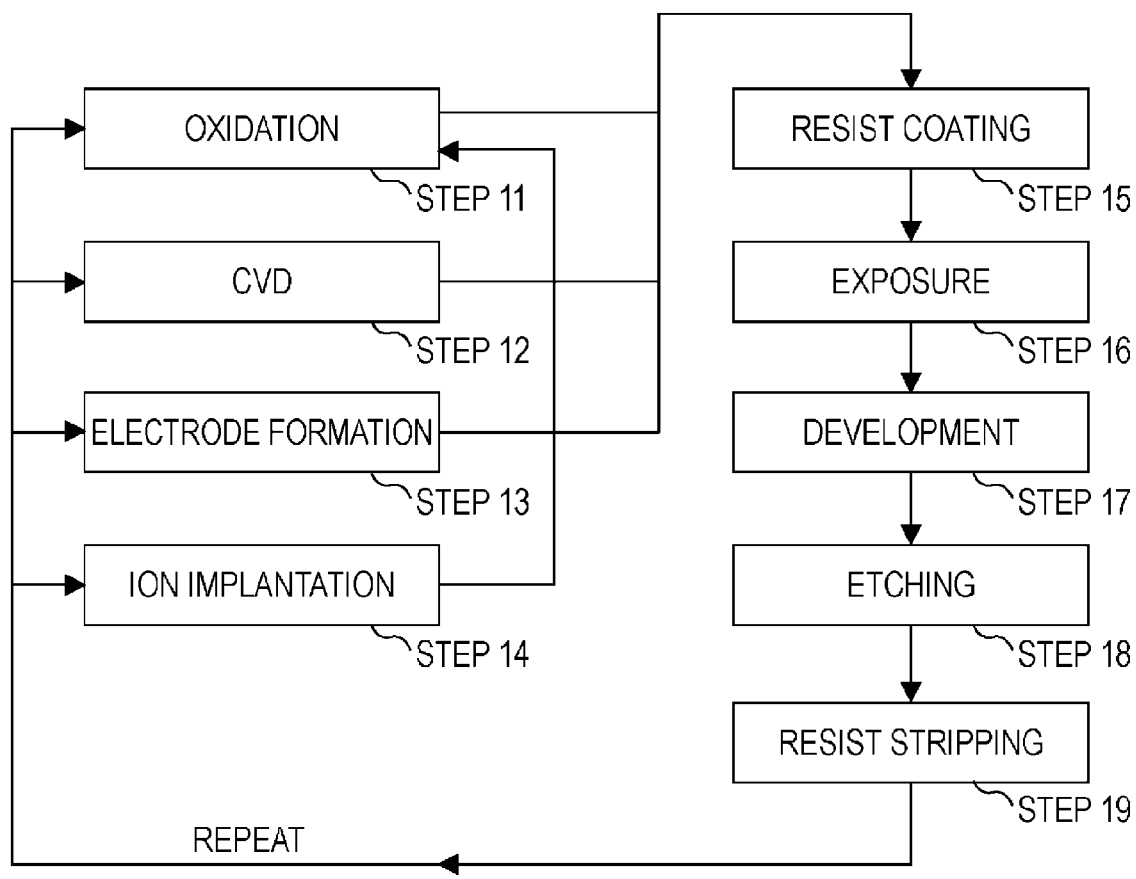
FIG. 6 is a detailed flowchart showing a wafer process in the flowchart shown in FIG. 5.

FIG. 6 is a detailed flowchart of the above-described wafer process (Step 4). In Step S11 (oxidation), the surface of the wafer is oxidized. In Step S12 (CVD), an insulating film is formed on the surface of the wafer. In Step S13 (electrode formation), electrodes are formed on the wafer by vapor deposition. In Step S14 (ion implantation), ions are implanted into the wafer. In Step S15 (resist coating), a photosensitive material is applied on the wafer. In Step S16 (exposure), the wafer is exposed via the circuit pattern of the mask with the exposure apparatus. In Step S17 (development), the exposed wafer is developed. In Step S18 (etching), a portion other than the developed resist image is removed. In Step S19 (resist stripping), the resist, which has become unnecessary after etching, is removed. By repeating these steps, multiple circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-263494 filed Oct. 9, 2007, which is hereby incorporated by reference herein in its entirety.

What is claimed is:

1. A driving device comprising:
   a plurality of laminated units formed by alternately stacking piezoelectric element layers and electrode layers;
   a failure detecting unit configured to detect failure of one or more of the laminated units;
   a plurality of switches provided corresponding to the laminated units and each configured to enable and disable current supply to one of the laminated units; and
   a driving circuit configured to supply a current for driving to a laminated unit of the laminated units which is not detected to be faulty, on the basis of an output from the failure detecting unit.

2. The driving device according to claim 1, wherein the failure detecting unit includes:
   a detection unit configured to detect currents passing through the laminated units or voltages applied to the laminated units; and
   a comparison unit configured to compare an output from the detection unit with a preset current or voltage reference value.

3. The driving device according to claim 1, wherein the failure detecting unit includes:
   a detection unit configured to detect displacement of the laminated units; and
   a comparison unit configured to compare an output from the detection unit with a preset displacement reference value.

4. A driving device as claimed in claim 1 in which the laminated units are physically arranged in series.

5. A driving device as claimed in claim 1 in which the laminated units are electrically connected in parallel.

6. An exposure apparatus comprising:
   a projection optical system configured to project a pattern of an original onto a substrate,
   wherein at least one optical element provided in the projection optical system is driven by a driving device comprising:
   a plurality of laminated units formed by alternately stacking piezoelectric element layers and electrode layers;
   a failure detecting unit configured to detect failure of one or more of the laminated units;
   a plurality of switches provided corresponding to the laminated units and each configured to enable and disable current supply to one of the laminated units; and
   a driving circuit configured to supply a current for driving to a laminated unit of the laminated units which is not detected to be faulty, on the basis of an output from the failure detecting unit.

7. A device manufacturing method comprising the steps of:
   exposing a substrate with an exposure apparatus; and
   developing the exposed substrate,
   wherein the exposure apparatus includes a driving device configured to drive at least one optical element provided in a projection optical system, and
   wherein the driving device includes:
   a plurality of laminated units formed by alternately stacking piezoelectric element layers and electrode layers;
   a failure detecting unit configured to detect failure of one or more of the laminated units;
   a plurality of switches provided corresponding to the laminated units and each configured to enable and disable current supply to one of the laminated units; and
   a driving circuit configured to supply a current for driving to a laminated unit of the laminated units detected not to be faulty, on the basis of an output from the failure detecting unit.

* * * * *